(12) United States Patent
Kim et al.

(10) Patent No.: US 9,832,010 B1
(45) Date of Patent: Nov. 28, 2017

(54) SIGNAL PROCESSING DEVICE AND SIGNAL PROCESSING METHOD

(71) Applicant: Korea University Research and Business Foundation, Seoul (KR)

(72) Inventors: Chul Woo Kim, Seoul (KR); Yeon Ho Lee, Gyeonggi-do (KR); Yoon Jae Choi, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/295,348

(22) Filed: Oct. 17, 2016

(30) Foreign Application Priority Data

May 24, 2016 (KR) .......................... 10-2016-0063453
Jul. 25, 2016 (KR) .......................... 10-2016-0094087

(51) Int. Cl.
*H04B 15/00* (2006.01)
*H04L 7/00* (2006.01)

(52) U.S. Cl.
CPC .......... *H04L 7/0091* (2013.01); *H04B 15/00* (2013.01)

(58) Field of Classification Search
CPC ... H04L 7/0091; H04L 1/0009; H04L 1/0014; H04L 1/0042; H04L 1/0075; H04L 1/0091; H04L 1/208; H04B 15/00; H04B 10/40; H04B 10/50; H04B 10/516; G06F 8/44; G06F 9/30156; G06F 2212/40
USPC .......................................... 375/259, 260, 295
See application file for complete search history.

(56) References Cited

U.S. PATENT DOCUMENTS

| | | | | |
|---|---|---|---|---|
| 4,740,994 A * | 4/1988 | Ouchi | ................. | H04L 25/4915 358/1.9 |
| 9,041,564 B2 * | 5/2015 | Pelley | ..................... | H03M 5/02 341/50 |
| 9,264,155 B2 * | 2/2016 | Kim | ........................ | H04L 7/033 |
| 2006/0132335 A1 * | 6/2006 | Kojima | ................... | H03M 7/06 341/58 |
| 2009/0219072 A1 * | 9/2009 | Sobue | ................. | H04L 25/0282 327/199 |

* cited by examiner

*Primary Examiner* — Siu Lee
(74) *Attorney, Agent, or Firm* — Fox Rothschild LLP

(57) ABSTRACT

The present solution provides a signal processing device, including: an encoder which encodes second transmitting data by referring to first transmitting data which is previously transmitted and the second transmitting data which is a current transmitting target such that at least one bit signal of the second transmitting data has a binary level different from that of a corresponding bit signal of the first transmitting data; and a transmitter which sequentially transmits the first transmitting data and the second transmitting data.

15 Claims, 16 Drawing Sheets

[FIG. 1]
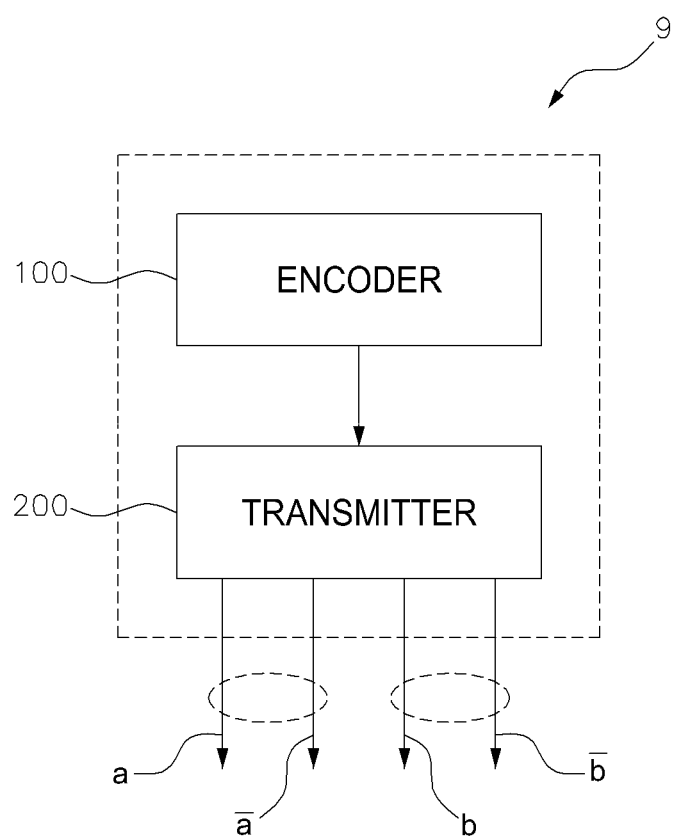

[FIG. 2]
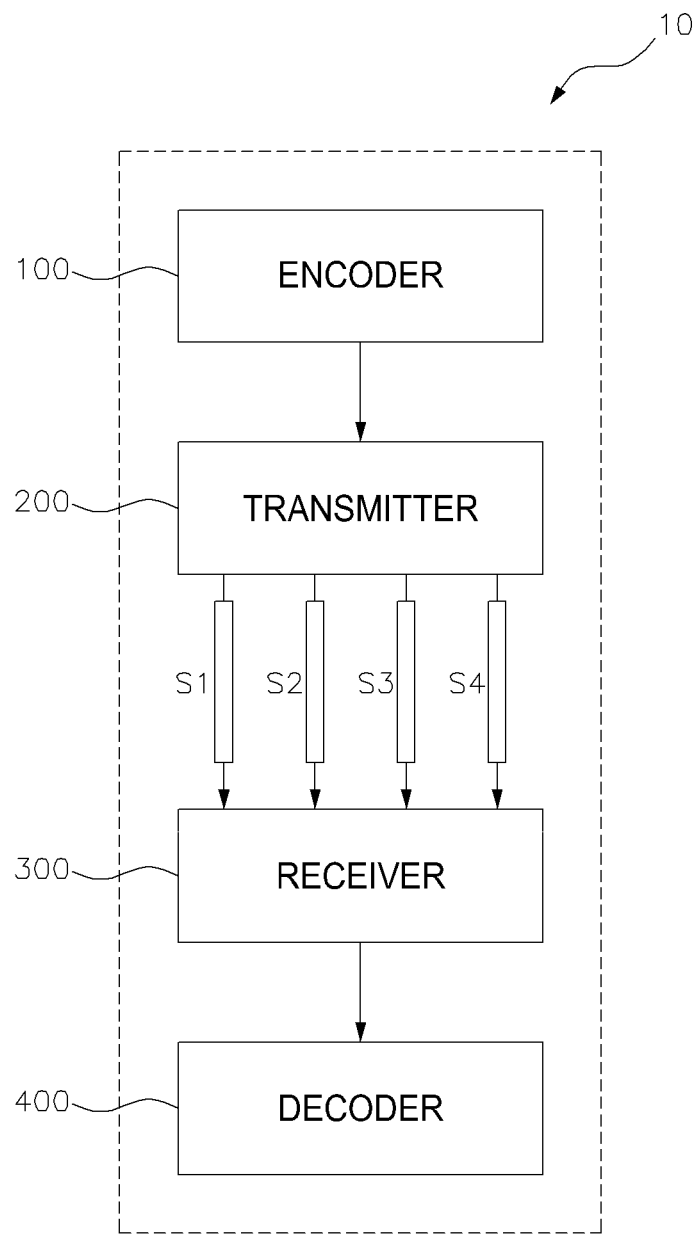

[FIG. 3]
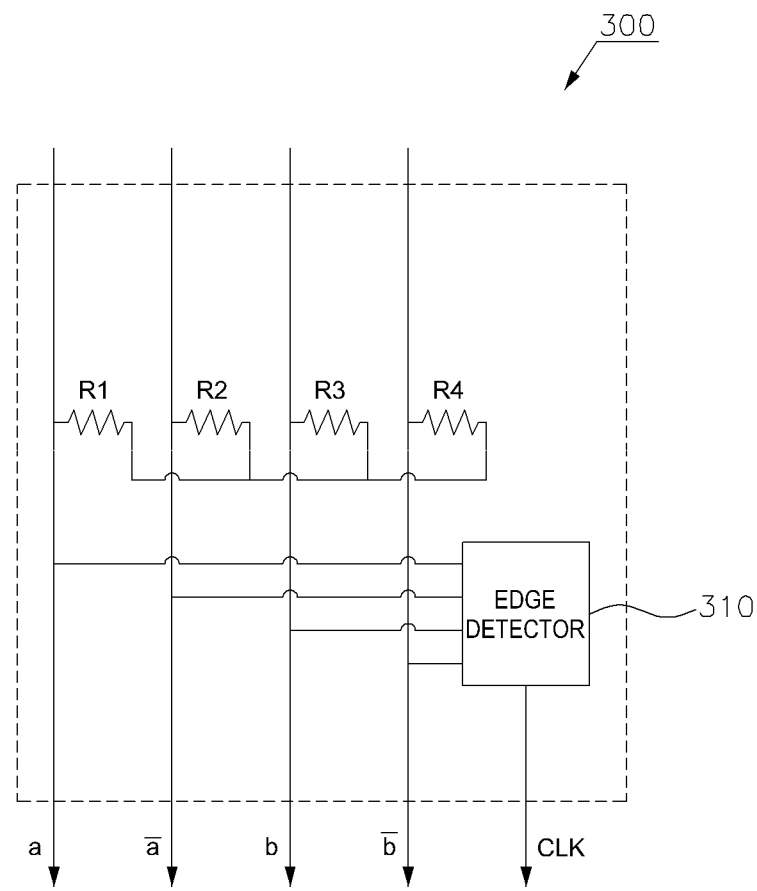

[FIG. 4]
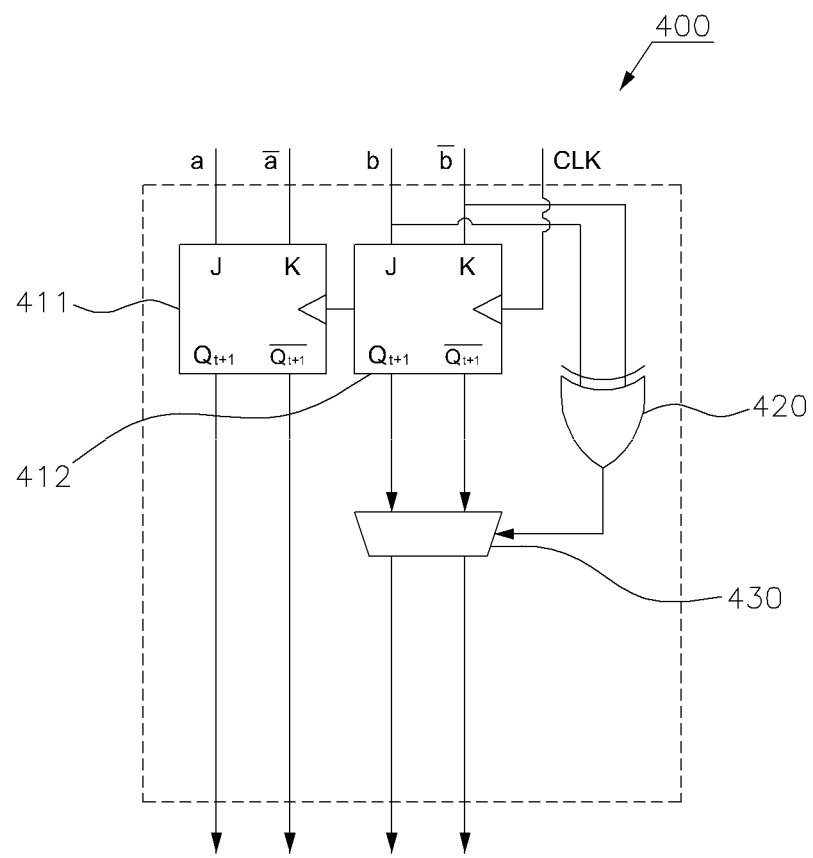

[FIG. 5]
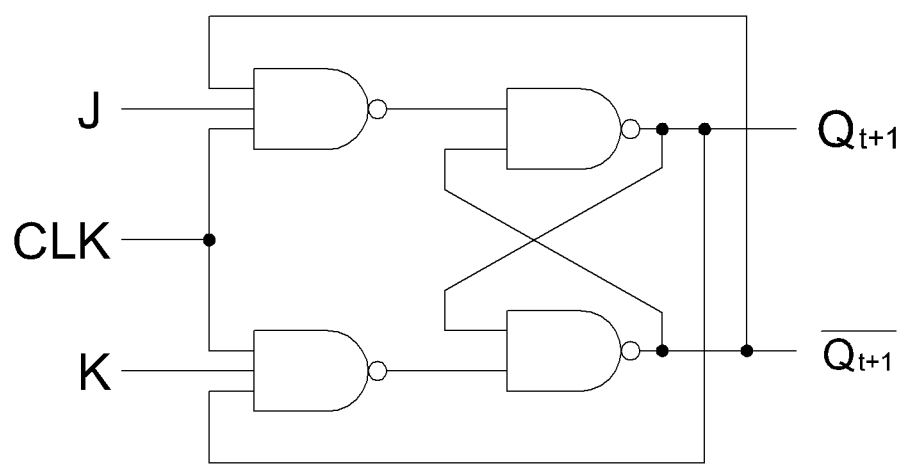

[FIG. 6]

| J | K | $Q_t$ | $Q_{t+1}$ |
|---|---|---|---|
| 0 | 0 | 0 | 0 |
| 0 | 1 | 0 | 0 |
| 1 | 0 | 0 | 1 |
| 1 | 1 | 0 | 1 |
| 0 | 0 | 1 | 1 |
| 0 | 1 | 1 | 0 |
| 1 | 0 | 1 | 1 |
| 1 | 1 | 1 | 0 |

[FIG. 7]
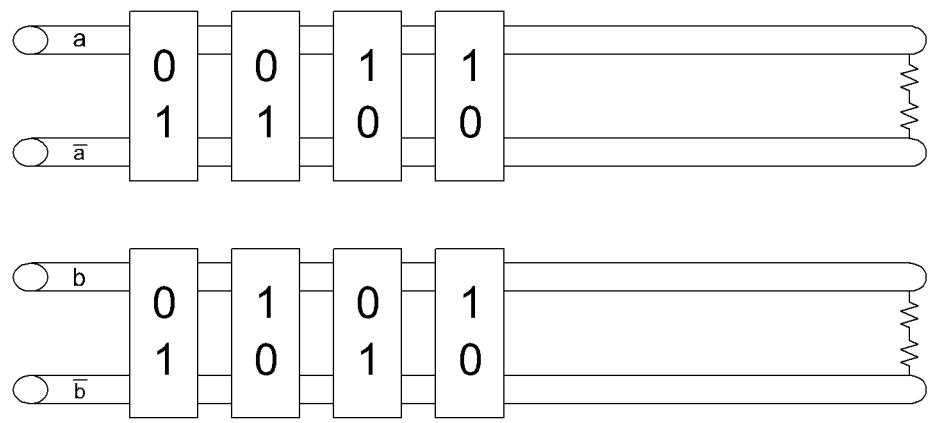

[FIG. 8]
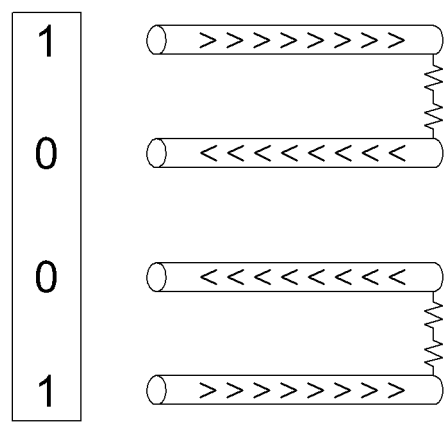

[FIG. 9]
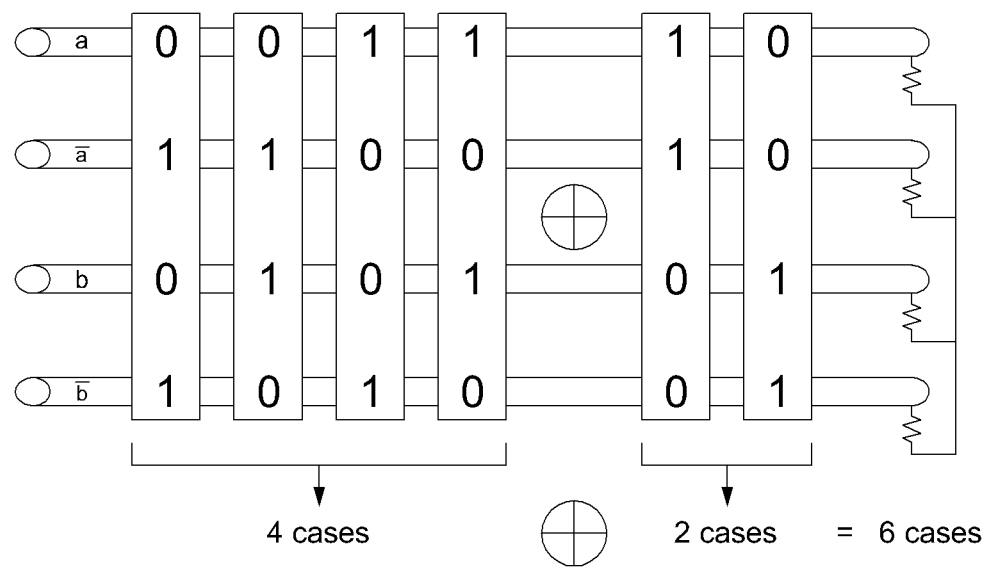

[FIG. 10]
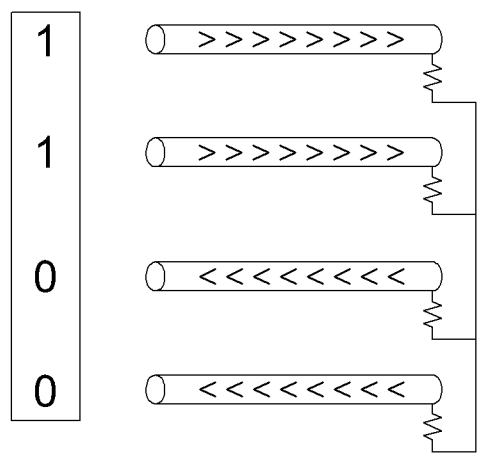

[FIG. 11]
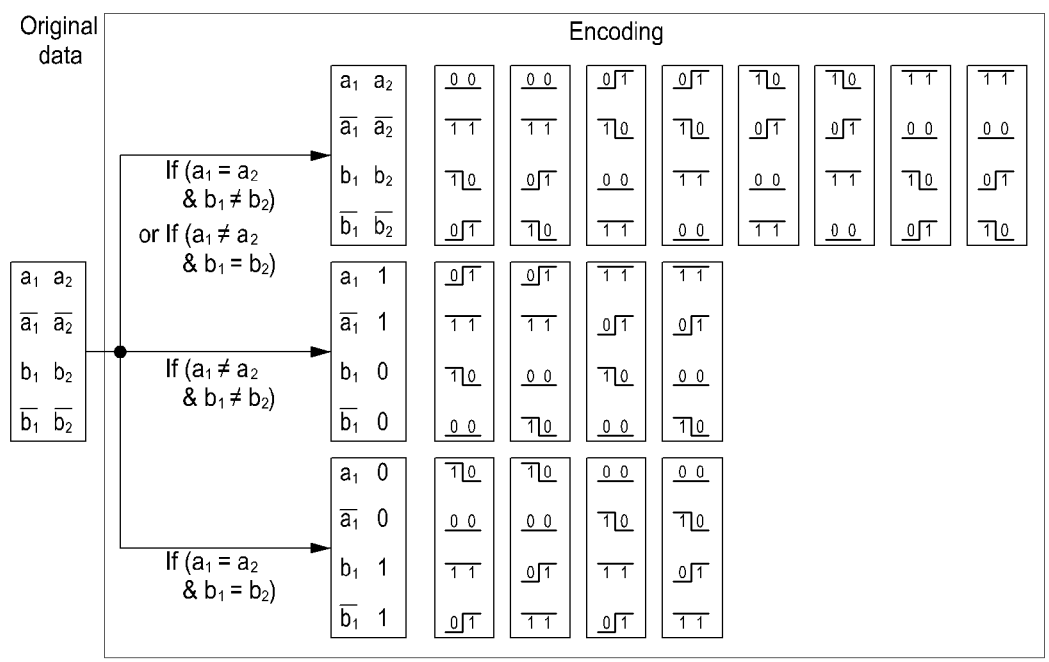

[FIG. 12]
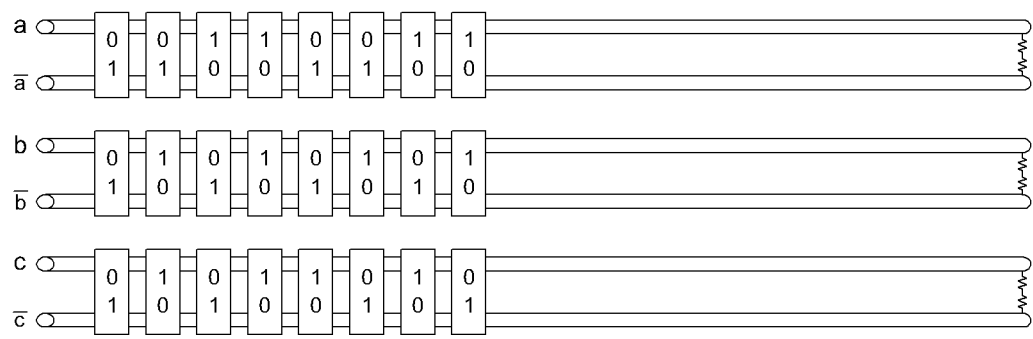

[FIG. 13]
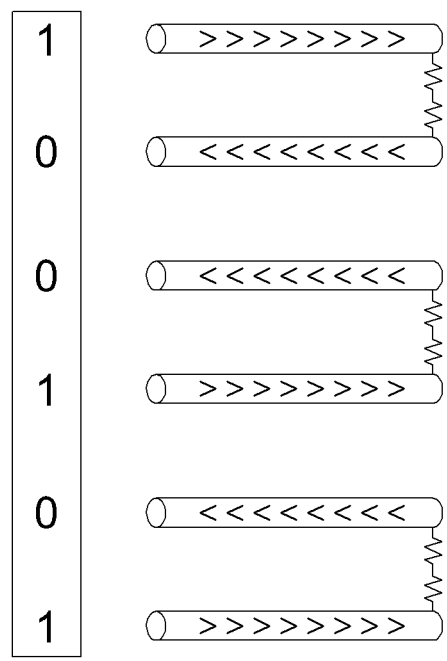

[FIG. 14]
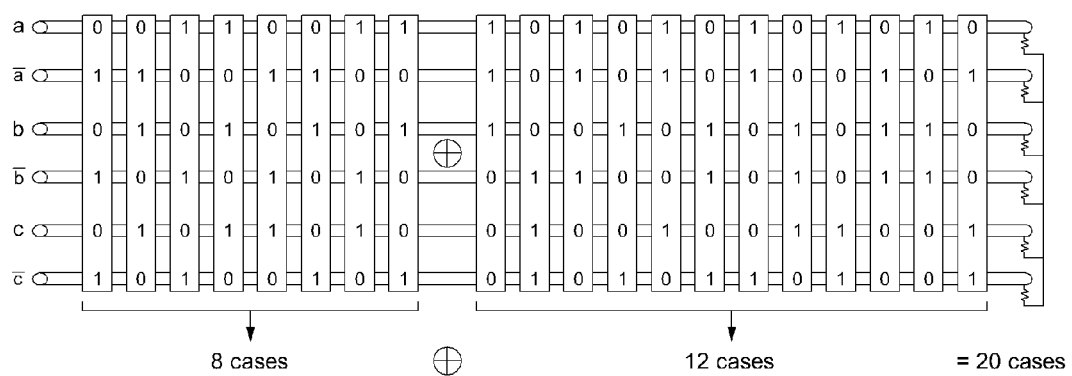

[FIG. 15]
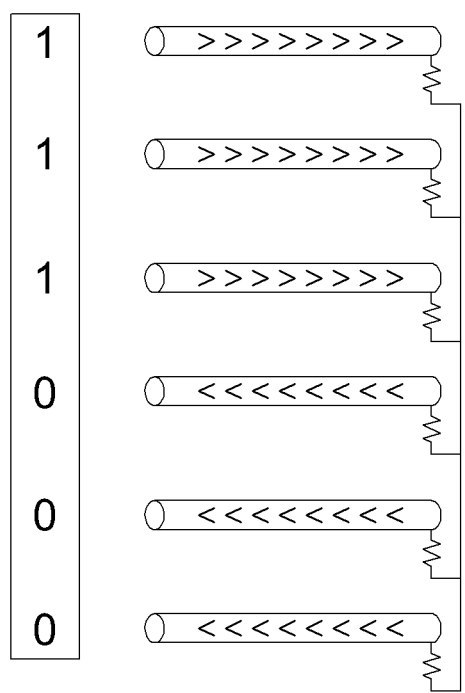

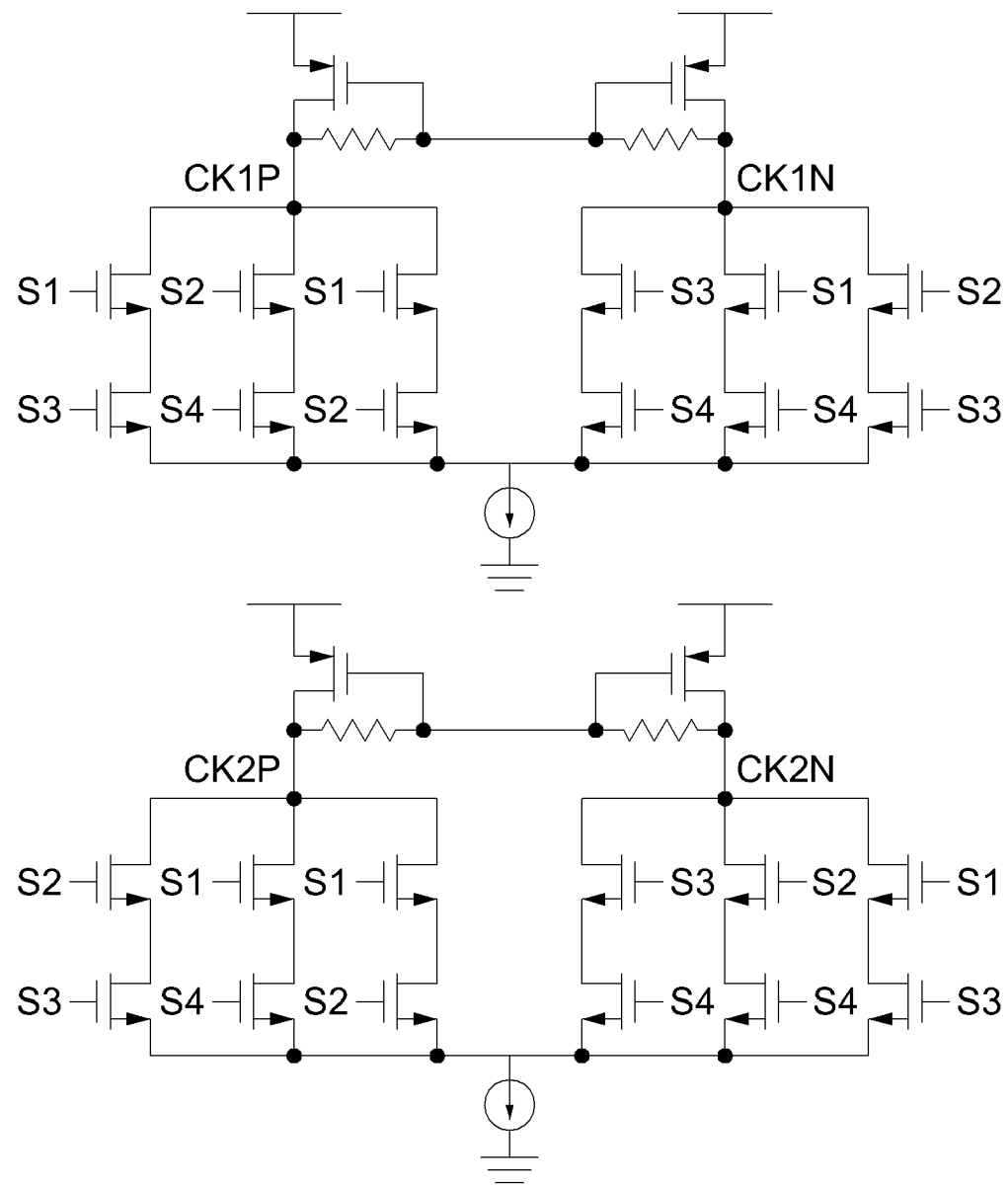
[FIG. 16]

SIGNAL PROCESSING DEVICE AND SIGNAL PROCESSING METHOD

CROSS-REFERENCE TO RELATED APPLICATIONS

This application claims the priorities of Korean Patent Application Nos. 10-2016-0063453 and 10-2016-0094087 filed on May 24, 2016 and Jul. 25, 2016, respectively, in the Korean Intellectual Property Office, the disclosures of which are incorporated herein by references.

BACKGROUND

Field

The present disclosure relates to a signal processing device and a signal processing method.

DESCRIPTION OF THE RELATED ART

As the structure of electronic products is becoming complicated in order to satisfy demands of consumers, the electronic products include a plurality of electronic components. A signal processing device may be a device which transmits and receives signals between the plurality of electronic components.

For example, a TV, a monitor, and a smart phone may include a signal processing device as an intra panel interface which connects a display panel and a timing controller (TCON).

The signal processing device may include a transmitter, or a receiver, or both a transmitter and a receiver. When an adjusted or known clock signal is provided between the transmitter and the receiver, received data may be read.

Most signal processing devices of the related art transmit a clock signal by adding a dummy bit to data. However, according to the technology of the related art, loss of a transmission bandwidth is inevitably caused due to usage of the dummy bit.

Further, among the technologies of the related art, a method which transmits a clock signal using not a digital data voltage level but a PAM type data voltage level may cause loss of a noise margin.

Further, among the technologies of the related art, according to a differential transmitting method, effects such as reduced EMI, a large noise margin, a return route, and a simultaneously minimized switching noise may be achieved. However, there is a problem in that types of transmittable signal are small as compared with the number of necessary signal lines.

The above-described differential method of the related art is disclosed in Korean Patent No. 10-0588752 (published on Jun. 2, 2006)

SUMMARY

An object to be achieved by the present disclosure is to provide a signal processing device and a signal processing method which transmit a clock signal by being loaded in data without using an additional dummy bit while maintaining a noise margin which is the same as in the related art by maintaining a digital manner, so that loss of the bandwidth is not caused.

According to an aspect of the present disclosure, there is provided a signal processing device. The signal processing device includes: an encoder which encodes second transmitting data by referring to first transmitting data which is previously transmitted and the second transmitting data which is a current transmitting target such that at least one bit signal of the second transmitting data has a binary level different from that of a corresponding bit signal of the first transmitting data; and a transmitter which sequentially transmits the first transmitting data and the second transmitting data.

Each of the first transmitting data and the second transmitting data may include M bit signals and the M bit signals include M/2 bit signal pairs, and the encoder may encode the second transmitting data depending on whether a plurality of bit signal pairs of the first transmitting data matches a plurality of bit signal pairs of the second transmitting data.

The first transmitting data may include a first bit signal pair and a second bit signal pair, the second transmitting data may include a third bit signal pair corresponding to the first bit signal pair and a fourth bit signal pair corresponding to the second bit signal pair, and when the first bit signal pair matches the third bit signal pair and the second bit signal pair does not match the fourth bit signal pair or the first bit signal pair does not match the third bit signal pair and the second bit signal pair matches the fourth bit signal pair, the encoder may process the second transmitting data after being encoded to be identical to the second transmitting data before being encoded.

When the first bit signal pair does not match the third bit signal pair and the second bit signal pair does not match the fourth bit signal pair, the encoder may process the second transmitting data after being encoded to include a plurality of first bit signals which is constant regardless of the second transmitting data before being encoded.

When the first bit signal pair matches the third bit signal pair and the second bit signal pair matches the fourth bit signal pair, the encoder may process the second transmitting data after being encoded to include a plurality of second bit signals which is constant regardless of the second transmitting data before being encoded and the plurality of first bit signals may be different from the plurality of second bit signals.

The signal processing device may further include: a receiver which sequentially receives first receiving data corresponding to the first transmitting data and second receiving data corresponding to the second transmitting data; and a decoder which decodes the second receiving data by referring to the first receiving data and the second receiving data.

The receiver may include an edge detector which detects a binary level change between the first receiving data and the second receiving data to generate a clock signal.

In the signal processing device, a frequency of the clock signal may be determined in accordance with an encoding period of the encoder.

The decoder may include a first JK flip-flop to which bit signal pairs corresponding to the first bit signal pair and the third bit signal pair are input; a second JK flip-flop to which bit signal pairs corresponding to the second bit signal pair and the fourth bit signal pair are input; an XOR gate element having an input terminal which is connected to an input terminal of the second JK flip-flop; and a signal selector having an input terminal which is connected to an output terminal of the second JK flip-flop and a selective terminal which is connected to an output terminal of the XOR gate element.

The decoder may output a bit signal pair of the output terminal of the first JK flip-flop and a bit signal pair of the output terminal of the signal selector as the decoded second receiving data.

The receiver may further include a plurality of termination resistors having one ends which are connected to a plurality of signal lines through which bit signals are transmitted and other ends which are connected to the same node.

According to another aspect of the present disclosure, there is provided a signal processing method. The signal processing method includes: an encoding step of encoding second transmitting data by referring to first transmitting data which is previously transmitted and the second transmitting data which is a current transmitting target such that at least one bit signal of the second transmitting data has a binary level different from that of a corresponding bit signal of the first transmitting data; and a transmitting step of sequentially transmitting the first transmitting data and the second transmitting data.

Each of the first transmitting data and the second transmitting data may include M bit signals and the M bit signals include M/2 bit signal pairs, and in the encoding step for the signal processing method, the second transmitting data may be encoded depending on whether to match a plurality of bit signal pairs of the first transmitting data and a plurality of bit signal pairs of the second transmitting data.

The method may further include: a receiving step of sequentially receiving first receiving data corresponding to the first transmitting data and second receiving data corresponding to the second transmitting data; and a decoding step of decoding the second receiving data by referring to the first receiving data and the second receiving data.

The method may further include: an edge detecting step of detecting a binary level change between the first receiving data and the second receiving data to generate a clock signal.

According to the signal processing device and the signal processing method of the present solution, the noise margin which is the same as in the related art is maintained by maintaining the digital manner and the clock signal is transmitted by being loaded in data without using an additional dummy bit, thereby removing the loss of bandwidth.

BRIEF DESCRIPTION OF DRAWINGS

The above and other aspects, features and other advantages of the present disclosure will be more clearly understood from the following detailed description taken in conjunction with the accompanying drawings.

FIG. 1 is a diagram for explaining a signal processing device.

FIG. 2 is a diagram for explaining a signal processing device.

FIG. 3 is a view for explaining a receiver.

FIG. 4 is a view for explaining a decoder.

FIG. 5 is a view for explaining a configuration of an exemplary JK flip-flop.

FIG. 6 is a view for explaining a truth table of an exemplary JK flip-flop.

FIG. 7 is a view for explaining a number of transmittable data in a differential transmitting method when the number of signal lines is four.

FIG. 8 is a view for explaining a return current route in a transmitting method of FIG. 7.

FIG. 9 is a view for explaining a number of transmittable data in a transmitting method.

FIG. 10 is a view for explaining a return current route in a transmitting method of FIG. 9.

FIG. 11 is a view for explaining an encoding method of an encoder.

FIG. 12 is a view for explaining a number of transmittable data in a differential transmitting method when the number of signal lines is six.

FIG. 13 is a view for explaining a return current route in a transmitting method of FIG. 12.

FIG. 14 is a view for explaining a number of transmittable data in a transmitting method.

FIG. 15 is a view for explaining a return current route in a transmitting method of FIG. 14.

FIG. 16 is a exemplary configuration of the edge detector.

DETAILED DESCRIPTION

Hereinafter, exemplary embodiments of the present invention will be described more fully with reference to the accompanying drawings for those skilled in the art to easily implement the present invention. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. Reference numbers which have been explained in the prior description may be used in other drawings.

The size and thickness of the components shown the drawings are optionally determined for better understanding and ease of description, and the present solution is not limited to the examples shown in the drawings. In the drawings, thicknesses of several layers and regions may be exaggerated for clear expressions.

FIG. 1 is a diagram for explaining a signal processing device according to an exemplary embodiment of the present disclosure.

Referring to FIG. 1, a signal processing device 9 may include an encoder 100 and a transmitter 200.

The encoder 100 encodes second transmitting data by referring to first transmitting data which is previously transmitted and the second transmitting data which is a current transmitting target such that at least one bit signal of the second transmitting data has a binary level different from that of a corresponding bit signal of the first transmitting data.

Each of the first transmitting data and the second transmitting data may include M bit signals and the M bit signals may include M/2 bit signal pairs. Here, M may be a natural number. In one exemplary scenario, M may be a natural number which is an even number.

Hereinafter, the signal processing device 9 and a signal processing device 10 which include four signal lines S1, S2, S3, and S4 or four channels between the transmitter 200 and a receiver 300 will be described as an example (see FIG. 2). However, as it will be described below with reference to FIGS. 12 to 15, the signal processing device 9 or 10 may include six signal lines. More or less number of signal lines is also applicable.

The transmitting data may include four bit signals $\bar{a}$, b, and $\bar{b}$ The four bit signals a, $\bar{a}$, b, and $\bar{b}$ may include two bit signal pairs. The two bit signal pairs may be a bit signal pair a and $\bar{a}$ and a bit signal pair b and $\bar{b}$.

The bit signals a, $\bar{a}$, b, $\bar{b}$ of the transmitting data may be parallel signals and transmitted through the signal lines S1, S2, S3, and S4.

First transmitting data may include four bit signals $\bar{a}_1$, $b_1$, and $\bar{b}_1$. The four bit signals $\bar{a}_1$, $b_1$, and $\bar{b}_1$ may include two bit signal pairs. The two bit signal pairs may be a first bit signal pair $a_1$ and $\bar{a}_1$ and a second bit signal pair $b_1$ and $\bar{b}_1$ (see FIG. 11).

Second transmitting data may include four bit signals $\bar{a}_2$, $b_2$, and $\bar{b}_2$. The four bit signals $a_2$, $\bar{a}_2$, $b_2$, and $\bar{b}_2$ may include two bit signal pairs. The two bit signal pairs may be a third bit signal pair $a_2$ and $\bar{a}_2$ and a fourth bit signal pair $b_2$ and $\bar{b}_2$ (see FIG. 11).

The encoder 100 may encode the second transmitting data depending on whether to match a plurality of bit signal pairs of the first transmitting data and a plurality of bit signal pairs of the second transmitting data.

The encoding method of the encoder 100 which depends on whether to match will be described in detail with reference to FIG. 11.

The transmitter 200 sequentially transmits the first transmitting data and the second transmitting data.

The transmitter 200 may include a configuration of the related art such as an impedance matching circuit, a serial converter, and a static electricity removing unit.

FIG. 2 is a diagram for explaining a signal processing device.

Referring to FIG. 2, a signal processing device 10 may include an encoder 100, a transmitter 200, a receiver 300, and a decoder 400.

The encoder 100 and the transmitter 200 are same as or similar to those of the signal processing device 9, so that redundant description will be omitted.

The transmitter 200 and the receiver 300 may be connected through a plurality of signal lines S1, S2, S3, and S4. The plurality of signal lines S1, S2, S3, and S4 may be a passage through which the bit signals a, $\bar{a}$, b, and $\bar{b}$ are transmitted.

The receiver 300 may sequentially receive first receiving data corresponding to the first transmitting data and second receiving data corresponding to the second transmitting data. A detailed configuration of the receiver 300 will be described below with reference to FIG. 3.

The decoder 400 may decode the second receiving data by referring to the first receiving data and the second receiving data. A detailed configuration of the decoder 400 will be described below with reference to FIG. 4.

FIG. 3 is a view for explaining a receiver.

Referring to FIG. 3, the receiver 300 may include a plurality of termination resistors R1, R2, R3, and R4 and an edge detector 310.

One ends of the plurality of termination resistors R1, R2, R3, and R4 are connected to the plurality of signal lines S1, S2, S3, and S4 to which bit signals are transmitted and the other ends are connected to the same node.

One end of the termination resistor R1 is connected to the signal line S1, one end of the termination resistor R2 is connected to the signal line S2, and one end of the termination resistor R3 is connected to the signal line S3 and one end of the termination resistor R4 is connected to the signal line S4. The other ends of the plurality of termination resistors R1, R2, R3, and R4 are connected to the same node.

The plurality of termination resistors R1, R2, R3, and R4 may provide a return current route in a differential transmitting method. This will be described with reference to FIGS. 10 and 15.

The edge detector 310 may detect a binary level change between the first receiving data and the second receiving data to generate a clock signal CLK. According to an encoding method, at least one bit signal of the second receiving data has a binary level different from that of a corresponding bit signal of the first receiving data. The edge detector 310 may detect transition of the bit signal to generate the clock signal CLK.

FIG. 16 is a exemplary configuration of the edge detector 310. Referring to FIG. 16, the transitions between the first receiving data and the second receiving data generate a clock signal CK1P, CK1N, CK2P and CK2N.

Therefore, the signal processing device 9 or 10 transmits the clock signal by being loaded in the data without providing an additional dummy bit, thereby removing the loss of the bandwidth.

The receiver 300 may further include a configuration of the related art such as an equalizer or a static electricity removing unit.

FIG. 4 is a view for explaining a decoder, FIG. 5 is a view for explaining a configuration of an exemplary JK flip-flop, and FIG. 6 is a view for explaining a truth table of an exemplary JK flip-flop.

Hereinafter, the present solution will be described with reference to FIG. 4 and if necessary, FIGS. 5 and 6 will be additionally referenced.

Referring to FIG. 4, a decoder 400 may include a first JK flip-flop 411, a second JK flip-flop 412, an XOR gate element 420, and a signal selector 430.

Bit signal pairs corresponding to the first bit signal pair $a_1$ and $\bar{a}_1$ and the third bit signal pair $a_2$ and $\bar{a}_2$ may be input to the first JK flip-flop 411. The first JK flop-flop 411 may operate in accordance with the clock signal CLK to output an output value according to a truth table of the JK flip-flop (see FIG. 6).

Bit signal pairs corresponding to the second bit signal pair $b_1$ and $\bar{b}_1$ and the fourth bit signal pair $b_2$ and $\bar{b}_2$ may be input to the second JK flip-flop 412. The second JK flop-flop 412 may operate in accordance with the clock signal CLK to output an output value according to a truth table of the JK flip-flop.

Referring to FIG. 5, an exemplary configuration of the JK flip-flop which may be taken by the first JK flip-flop 411 and the second JK flip-flop 412 is illustrated. The JK flip-flop of FIG. 5 is configured by four NAND gate elements.

Those skilled in the art may configure the first and second flip-flops 411 and 412 using another gate element or through another connection method to achieve the effect of the present disclosure.

An input terminal of the XOR gate element 420 may be connected to an input terminal of the second JK flip-flop 412. That is, the XOR gate element 420 may receive the bit signal pairs corresponding to the second bit signal pair $b_1$ and $\bar{b}_1$ and the fourth bit signal pair $b_2$ and $\bar{b}_2$ as inputs. The output value of the XOR gate element 420 is transmitted to a selective terminal of the signal selector 430.

An input terminal of the signal selector 430 may be connected to an output terminal of the second JK flip-flop 412 and the selective terminal may be connected to the output terminal of the XOR gate element 420.

When the output value of the XOR gate element 420 has a logical value of 0, the signal selector 430 may change the output value of the second JK flip-flop 412 to output the changed output value.

For example, when the logical values of the output value of the second JK flip-flop 412 are 0 and 1 and the logical value of the output value of the XOR gate element 420 is 0, the signal selector 430 may output the logical values of 1 and 0.

For example, when the logical values of the output value of the second JK flip-flop 412 are 1 and 0 and the logical value of the output value of the XOR gate element 420 is 0, the signal selector 430 may output the logical values of 0 and 1.

When the output value of the XOR gate element 420 has a logical value of 1, the signal selector 430 may output the output value of the second JK flip-flop 412 as it is.

For example, when the logical values of the output value of the second JK flip-flop 412 are 0 and 1 and the logical value of the output value of the XOR gate element 420 is 1, the signal selector 430 may output the logical values of 0 and 1.

Further, for example, when the logical values of the output value of the second JK flip-flop 412 are 1 and 0 and the logical value of the output value of the XOR gate element 420 is 1, the signal selector 430 may output the logical values of 1 and 0.

The signal selector 430 may be configured by partially modifying a configuration of a multiplexer of the related art. Those skilled in the art may configure the signal selector 430 which performs the same input/output processing in various different forms, through combination of the logical gate elements of the related art.

The decoder 400 may output the bit signal pair of the output terminal of the first JK flip-flop 411 and the bit signal pair of the signal selector 430 as second decoded receiving data.

The first transmitting data is not modified through an encoding process so that the value of the first receiving data does not need to be modified during a decoding process.

The decoder 400 illustrated in FIG. 4 is an exemplary configuration which decodes transmitting data which is encoded by an encoding method. Those skilled in the art may configure a different decoder configuration which decodes the same encoding data.

FIG. 7 is a view for explaining a number of transmittable data in a differential transmitting method when the number of signal lines is four.

Referring to FIG. 7, when four signal lines are provided, four types of data may be transmitted according to the differential transmitting method.

The four data may be [0, 1, 0, 1], [0, 1, 1, 0], [1, 0, 0, 1], and [1, 0, 1, 0].

FIG. 8 is a view for explaining a return current route in a transmitting method of FIG. 7.

Referring to FIG. 8, a return current route generated when the data of [1, 0, 0, 1] is transmitted by the transmitting method of FIG. 7 is illustrated.

A first bit signal (in a descending order) 1 passes through the termination resistor to form a return current route to a second bit signal 0.

A fourth bit signal 1 passes through the termination resistor to form a return current route to a third bit signal 0.

FIG. 9 is a view for explaining a number of transmittable data in a transmitting method.

Referring to FIG. 9, the signal processing device 9 or 10 may transmit additional two data, in addition to the four data which may be transmitted by the transmitting method of FIG. 7.

The added two data may be [1, 1, 0, 0] and [0, 0, 1, 1].

FIG. 10 is a view for explaining a return current route in a transmitting method of FIG. 9.

Referring to FIG. 10, a return current route generated when the data of [1, 1, 0, 0] is transmitted by the transmitting method of FIG. 9 is illustrated.

Referring to FIG. 10, it is confirmed that the other ends of the plurality of termination resistors are connected to the same node, so that the return current route is secured.

FIG. 11 is a view for explaining an encoding method of an encoder.

As described above, the encoder 100 encodes second transmitting data by referring to first transmitting data which is previously transmitted and the second transmitting data which is a current transmitting target such that at least one bit signal of the second transmitting data has a binary level different from that of a corresponding bit signal of the first transmitting data.

In this case, the encoder 100 may encode the second transmitting data depending on whether to match a plurality of bit signal pairs of the first transmitting data and a plurality of bit signal pairs of the second transmitting data.

As described above, the first transmitting data includes the first bit signal pair $a_1$ and $\bar{a}_1$ and the second bit signal pair $b_1$ and $\bar{b}_1$ and the second transmitting data includes the third bit signal pair $a_2$ and $\bar{a}_2$ and the fourth bit signal pair $b_2$ and $\bar{b}_2$.

When the first bit signal pair $a_1$ and $\bar{a}_1$ matches the third bit signal pair $a_2$ and $\bar{a}_2$ and the second bit signal pair $b_1$ and $\bar{b}_1$ does not match the fourth bit signal pair $b_2$ and $\bar{b}_2$ (hereinafter, referred to as a first condition) or the first bit signal pair $a_1$ and $\bar{a}_1$ does not match the third bit signal pair $a_2$ and $\bar{a}_2$ and the second bit signal pair $b_1$ and $\bar{b}_1$ matches the fourth bit signal pair $b_2$ and $\bar{b}_2$ (hereinafter, referred to as a second condition), the encoder 100 may process the second transmitting data after being encoded to be identical to the second transmitting data before being encoded.

In the first condition and the second condition, at least one bit signal of the second transmitting data has a binary level different from that of the corresponding bit signal of the first transmitting data, so that there is no need to modify the second transmitting data.

When the first bit signal pair $a_1$ and $\bar{a}_1$ does not match the third bit signal pair $a_2$ and $\bar{a}_2$ and the second bit signal pair $b_1$ and $\bar{b}_1$ does not match the fourth bit signal pair $b_2$ and $\bar{b}_2$ (hereinafter, referred to as a third condition), the encoder 100 may process the second transmitting data after being encoded to include a plurality of first bit signals [1, 1, 0, 0] which is constant regardless of the second transmitting data before being encoded.

Therefore, in the third condition, at least one bit signal of the encoded second transmitting data has a binary level different from that of the corresponding bit signal of the first transmitting data.

When the first bit signal pair $a_1$ and $\bar{a}_1$ matches the third bit signal pair $a_2$ and $\bar{a}_2$ and the second bit signal pair $b_1$ and $\bar{b}_1$ matches the fourth bit signal pair $b_2$ and $\bar{b}_2$ (hereinafter, referred to as a fourth condition), the encoder 100 may process the second transmitting data after being encoded to include a plurality of second bit signals [0, 0, 1, 1] which is constant regardless of the second transmitting data before being encoded.

Therefore, in the fourth condition, at least one bit signal of the encoded second transmitting data has a binary level different from that of the corresponding bit signal of the first transmitting data.

The plurality of first bit signals [1, 1, 0, 0] may be different from the plurality of second bit signals [0, 0, 1, 1]. However, the plurality of first bit signals may have data of [0, 0, 1, 1] and the plurality of second bit signals may have data of [1, 1, 0, 0].

Additionally, a frequency of the clock signal CLK may be determined in accordance with an encoding period of the encoder 100. In this case, the maximum frequency of the clock signal CLK may be a quarter of a maximum data bandwidth.

For example, transition of the bit signal may be detected in a first period between first transmitting data and second transmitting data and transition of the bit signal may be detected in a subsequent second period between first transmitting data and second transmitting data. However, in this case, a clock signal CLK for one period may be generated through a total of four transmitting data.

FIG. 12 is a view for explaining a number of transmittable data in a differential transmitting method when the number of signal lines is six.

Referring to FIG. 12, when six signal lines are provided, eight types of data may be transmitted according to the differential transmitting method.

The eight data may be [0, 1, 0, 1, 0, 1], [0, 1, 1, 0, 1, 0], [1, 0, 0, 1, 0, 1], [1, 0, 1, 0, 1, 0], [0, 1, 0, 1, 1, 0], [0, 1, 1, 0, 0, 1], [1, 0, 0, 1, 1, 0], and [1, 0, 1, 0, 0, 1].

FIG. 13 is a view for explaining a return current route in a transmitting method of FIG. 12.

Referring to FIG. 13, a return current route generated when the data of [1, 0, 0, 1, 0, 1] is transmitted by the transmitting method of FIG. 12 is illustrated.

A first bit signal (in a descending order) 1 passes through the termination resistor to form a return current route to a second bit signal 0.

A fourth bit signal 1 passes through the termination resistor to form a return current route to a third bit signal 0.

A sixth bit signal 1 passes through the termination resistor to form a return current route to a fifth bit signal 0.

FIG. 14 is a view for explaining a number of transmittable data in a transmitting method.

Referring to FIG. 14, the signal processing device 9 or 10 may additionally transmit twelve data, in addition to the eight data which may be transmitted by the transmitting method of FIG. 12.

The added twelve data may be [1, 1, 1, 0, 0, 0], [0, 0, 0, 1, 1, 1], [1, 1, 0, 1, 0, 0], [0, 0, 1, 0, 0, 1], [1, 1, 0, 0, 1, 0], [0, 0, 1, 1, 0, 1], [1, 1, 0, 0, 0, 1], [0, 0, 1, 1, 1, 0], [1, 0, 0, 0, 1, 1], [0, 1, 1, 1, 0, 0], [1, 0, 1, 1, 0, 0], and [0, 1, 0, 0, 1, 1].

FIG. 15 is a view for explaining a return current route in a transmitting method of FIG. 14.

Referring to FIG. 15, a return current route generated when the data of [1, 1, 1, 0, 0, 0] is transmitted by the transmitting method of FIG. 14 is illustrated.

According to the signal processing device 9 or 10, the following advantageous effects may be achieved.

The data and the clock are simultaneously transmitted without using an additional dummy bit, so that an effective transmitting bandwidth may be increased. The speed load of an actual transceiver circuit may be reduced due to the increased effective transmitting bandwidth.

Further, the clock is transmitted without causing the bandwidth loss, so that a fast clock may be transmitted together with the data. Therefore, an area and power consumption of a frequency multiplier which generates a fast clock required for a data sampling and equalizing circuit at a receiving terminal may be reduced.

The additional dummy bit is removed, thereby reducing unnecessary power consumption.

A decode using a simple JK flip-flop manner is used to minimize delay caused during a decoding process and the decoding is performed through data which is continuously input, so that there is no need to provide an additional digital buffer.

Since a digital type voltage level is used so that a maximum voltage noise margin may be secured in a situation where the power is supplied with a physical restriction of a device.

A plurality of transmission lines is tied to secure differential effects, to maintain advantages of the technologies of the related art.

The transmitting method of the present disclosure may also be referred to as a braid signaling method.

The above-referred drawings and the detailed description of the present disclosure are provided for illustrative purposes only but not intended to limit the scope of the present disclosure described in the appending claims. Therefore, it will be appreciated to those skilled in the art that various modifications are made and other equivalent embodiments are available. Accordingly, the actual scope of the present solution must be determined by the spirit of the appended claims.

What is claimed is:

1. A signal processing device, comprising:
an encoder which encodes second transmitting data by referring to first transmitting data which is previously transmitted and the second transmitting data which is a current transmitting target such that at least one bit signal of the second transmitting data has a binary level different from that of a corresponding bit signal of the first transmitting data; and
a transmitter which sequentially transmits the first transmitting data and the second transmitting data.

2. The signal processing device according to claim 1, wherein each of the first transmitting data and the second transmitting data includes M bit signals and the M bit signals include M/2 bit signal pairs, and
the encoder encodes the second transmitting data depending on whether a plurality of bit signal pairs of the first transmitting data matches a plurality of bit signal pairs of the second transmitting data.

3. The signal processing device according to claim 2, wherein the first transmitting data includes a first bit signal pair and a second bit signal pair,
the second transmitting data includes a third bit signal pair corresponding to the first bit signal pair and a fourth bit signal pair corresponding to the second bit signal pair, and
when the first bit signal pair matches the third bit signal pair and the second bit signal pair does not match the fourth bit signal pair, or when the first bit signal pair does not match the third bit signal pair and the second bit signal pair matches the fourth bit signal pair, the encoder processes the second transmitting data after being encoded to be identical to the second transmitting data before being encoded.

4. The signal processing device according to claim 3, wherein when the first bit signal pair does not match the third bit signal pair and the second bit signal pair does not match the fourth bit signal pair, the encoder processes the second transmitting data after being encoded to include a plurality of first bit signals which is constant regardless of the second transmitting data before being encoded.

5. The signal processing device according to claim 4, wherein when the first bit signal pair matches the third bit signal pair and the second bit signal pair matches the fourth bit signal pair, the encoder processes the second transmitting data after being encoded to include a plurality of second bit signals which is constant regardless of the second transmitting data before being encoded and the plurality of first bit signals is different from the plurality of second bit signals.

6. The signal processing device according to claim 1, further comprising:
   a receiver which sequentially receives first receiving data corresponding to the first transmitting data and second receiving data corresponding to the second transmitting data; and
   a decoder which decodes the second receiving data by referring to the first receiving data and the second receiving data.

7. The signal processing device according to claim 6, wherein the receiver includes an edge detector which detects a binary level change between the first receiving data and the second receiving data to generate a clock signal.

8. The signal processing device according to claim 7, wherein a frequency of the clock signal is determined in accordance with an encoding period of the encoder.

9. The signal processing device according to claim 8, wherein the decoder includes:
   a first JK flip-flop to which bit signal pairs corresponding to a first bit signal pair and a third bit signal pair are input;
   a second JK flip-flop to which bit signal pairs corresponding to a second bit signal pair and a fourth bit signal pair are input;
   an XOR gate element having an input terminal which is connected to an input terminal of the second JK flip-flop; and
   a signal selector having an input terminal which is connected to an output terminal of the second JK flip-flop and a selective terminal which is connected to an output terminal of the XOR gate element.

10. The signal processing device according to claim 9, wherein the decoder outputs a bit signal pair of an output terminal of the first JK flip-flop and a bit signal pair of an output terminal of the signal selector as the decoded second receiving data.

11. The signal processing device according to claim 6, wherein the receiver further includes: a plurality of termination resistors having one ends which are connected to a plurality of signal lines through which bit signals are transmitted and other ends which are connected to a same node.

12. A signal processing method, comprising:
   an encoding step of encoding second transmitting data by referring to first transmitting data which is previously transmitted and the second transmitting data which is a current transmitting target such that at least one bit signal of the second transmitting data has a binary level different from that of a corresponding bit signal of the first transmitting data; and
   a transmitting step of sequentially transmitting the first transmitting data and the second transmitting data.

13. The signal processing method according to claim 12, wherein each of the first transmitting data and the second transmitting data includes M bit signals and the M bit signals include M/2 bit signal pairs, and
   in the encoding step, the second transmitting data is encoded depending on whether to match a plurality of bit signal pairs of the first transmitting data and a plurality of bit signal pairs of the second transmitting data.

14. The signal processing method according to claim 13, further comprising:
   a receiving step of sequentially receiving first receiving data corresponding to the first transmitting data and second receiving data corresponding to the second transmitting data; and
   a decoding step of decoding the second receiving data by referring to the first receiving data and the second receiving data.

15. The signal processing method according to claim 14, further comprising:
   an edge detecting step of detecting a binary level change between the first receiving data and the second receiving data to generate a clock signal.

* * * * *